United States Patent
Rahim et al.

(10) Patent No.: US 8,072,237 B1
(45) Date of Patent: Dec. 6, 2011

(54) COMPUTER-AIDED DESIGN TOOLS AND MEMORY ELEMENT POWER SUPPLY CIRCUITRY FOR SELECTIVELY OVERDRIVING CIRCUIT BLOCKS

(75) Inventors: Irfan Rahim, Milpitas, CA (US); Andy L. Lee, San Jose, CA (US)

(73) Assignee: Altera Corporation, San Jose, CA (US)

( * ) Notice: Subject to any disclaimer, the term of this patent is extended or adjusted under 35 U.S.C. 154(b) by 71 days.

(21) Appl. No.: 12/478,713

(22) Filed: Jun. 4, 2009

(51) Int. Cl.
*G06F 7/38* (2006.01)
*H01L 25/00* (2006.01)

(52) U.S. Cl. ............... 326/39; 326/47; 326/37; 326/41; 326/101; 365/63; 365/226; 365/227; 713/300; 713/310; 713/320; 713/330

(58) Field of Classification Search .............. 326/37–39, 326/41, 47, 101; 365/63, 226–227; 713/300, 713/310, 320, 330
See application file for complete search history.

(56) References Cited

U.S. PATENT DOCUMENTS

| | | | |
|---|---|---|---|
| 5,122,846 A | 6/1992 | Haken | |
| 5,642,315 A | 6/1997 | Yamaguchi | |
| 5,801,551 A | 9/1998 | Lin | |
| 6,025,737 A | 2/2000 | Patel et al. | |
| 6,232,893 B1 | 5/2001 | Cliff et al. | |
| 6,335,893 B1 | 1/2002 | Tanaka et al. | |
| 6,366,224 B2 * | 4/2002 | Cliff et al. ........................ | 341/78 |
| 6,433,585 B1 | 8/2002 | Patel et al. | |
| 6,483,165 B2 * | 11/2002 | Ooishi et al. ................... | 257/499 |
| 6,519,191 B1 | 2/2003 | Morishita | |
| 6,643,162 B2 * | 11/2003 | Takeuchi et al. ............... | 365/145 |
| 6,724,222 B2 | 4/2004 | Patel et al. | |
| 6,777,978 B2 | 8/2004 | Hart et al. | |
| 6,795,332 B2 | 9/2004 | Yamaoka et al. | |
| 6,897,679 B2 | 5/2005 | Cliff et al. | |
| 7,180,334 B2 | 2/2007 | Starr | |
| 7,266,028 B1 * | 9/2007 | Ghosh Dastidar ............ | 365/201 |
| 7,276,932 B2 * | 10/2007 | Kuang et al. .................... | 326/33 |
| 7,277,351 B2 * | 10/2007 | Liu et al. ........................ | 365/226 |
| 7,358,764 B1 * | 4/2008 | Chan et al. ....................... | 326/38 |
| 7,411,853 B2 * | 8/2008 | Liu et al. ........................ | 365/226 |
| 7,430,148 B2 * | 9/2008 | Liu et al. ........................ | 365/226 |
| 7,463,057 B1 * | 12/2008 | Rahim et al. .................... | 326/38 |

(Continued)

OTHER PUBLICATIONS

U.S. Appl. No. 11/335,437, filed Jan. 18, 2006, Liu et al.

(Continued)

*Primary Examiner* — Shawki S Ismail
*Assistant Examiner* — Matthew C Tabler
(74) *Attorney, Agent, or Firm* — Treyz Law Group; G. Victor Treyz; Jason Tsai

(57) ABSTRACT

Integrated circuits are provided with circuitry such as multiplexers that can be selectively configured to route different adjustable power supply voltages to different circuit blocks on the integrated circuits. The circuit blocks may contain memory elements that are powered by the power supply voltages and that provide corresponding static output control signals at magnitudes that are determined by the power supply voltages. The control signals from the memory elements may be applied to the gates of transistors in the circuit blocks. Logic on an integrated circuit may be powered at a given power supply voltage level. The memory elements may provide their output signals at overdrive voltage levels that are elevated with respect to the given power supply voltage level. Memory elements associated with circuit blocks that contain critical paths can be overdriven at voltages that are larger than memory elements associated with circuit blocks that contain noncritical paths.

20 Claims, 12 Drawing Sheets

U.S. PATENT DOCUMENTS

2005/0280437 A1   12/2005  Lewis et al.
2007/0109017 A1*  5/2007  Liu et al. .......................... 326/41
2007/0109899 A1*  5/2007  Liu et al. ........................ 365/226
2007/0113106 A1*  5/2007  Liu et al. ........................ 713/300

OTHER PUBLICATIONS

U.S. Appl. No. 11/282,437, filed Nov. 17, 2005, Liu et al.
U.S. Appl. No. 11/282,858, filed Nov. 17, 2005, Liu et al.

* cited by examiner

COMPUTER-AIDED DESIGN TOOLS AND MEMORY ELEMENT POWER SUPPLY CIRCUITRY FOR SELECTIVELY OVERDRIVING CIRCUIT BLOCKS

BACKGROUND

This invention relates to integrated circuits, and more particularly, to integrated circuits with memory element power supply circuitry that can be adjusted to supply overdrive voltages to selected circuit blocks on an integrated circuit.

Integrated circuits often contain memory elements such as random-access memory cells. Memory elements can be used to store data during digital processing operations. On programmable integrated circuits, memory elements can be used to store configuration data. Once loaded with a configuration data bit, a memory element can supply a static control signal to the gate of a programmable logic transistor. The logic high or logic low state of the configuration bit determines whether the transistor is turned on or off. By configuring numerous transistors, programmable logic on an integrated circuit can be programmed to perform a custom logic function.

The transistors that are configured in this way are typically formed using n-channel and p-channel metal-oxide-semiconductor transistor structures. When used to selectively pass or block the transmission of a data signal, these transistors are sometimes referred to as pass gates. Pass gates are often formed from n-channel transistors. When a low voltage is applied to the gate of an n-channel pass gate, the pass gate will be turned off and signals will be prevented from passing between its source and drain terminals. When a high voltage is applied to the gate of an n-channel pass gate, signals are allowed to pass between the source and drain terminals.

Due to the electrical properties of n-channel metal-oxide-semiconductor transistors, it is difficult to pass a logic one value between the source and drain terminals of an n-channel pass gate if the controlling voltage that is applied to the gate of the pass gate has the same magnitude as the logic one value. As a result, programmable integrated circuits are sometimes provided with memory elements that supply pass gate control signals at elevated voltages. These elevated voltages overdrive the pass gates when the pass gates are turned on and thereby improve pass gate performance.

The gate oxides of metal-oxide-semiconductor transistors can break down when subjected to excessively high overdrive voltages. Excessively high overdrive voltages should therefore be avoided to ensure adequate reliability.

While avoidance of high overdrive voltages can help improve reliability, overly conservative overdrive schemes can cause performance to suffer. If overdrive levels are inadequate, pass gates may be driven too weakly and may introduce unacceptable data path signal delays.

It would therefore be desirable to be able to address issues such as reliability and performance issues on integrated circuits with memory elements that produce overdrive pass gate control voltages.

SUMMARY

Integrated circuits are provided with adjustable power supply circuitry. The adjustable power supply circuitry can provide adjustable memory element power supply voltages for supplying memory elements on an integrated circuit with different amounts of power supply voltage. Some blocks of circuitry on an integrated circuit may contain signal paths associated with relatively tight timing requirements (sometimes referred to as critical paths). Other blocks of circuitry may contain signal paths with less stringent timing constraints.

Memory elements on an integrated circuit may be loaded with configuration data. Each memory element may provide a corresponding static output control signal at a logic low (ground) or logic high level depending on the value of the configuration data bit loaded into that memory element. The static output control signals may be applied to the gates of transistors on the integrated circuit such as n-channel metal-oxide-semiconductor transistors that serve as pass gate transistors. The magnitude of the static output control signals produced by memory elements that have been loaded with logic ones depends on the power supply voltage that is used to power the memory elements. Memory elements that are powered using a first power supply voltage may produce static output control signals at the first power supply voltage, whereas memory elements that are powered using a second power supply voltage may produce static output control signals at the second power supply voltage.

To ensure satisfactory pass gate performance, the memory elements may be powered using voltages that are larger than the power supply voltage used for normal logic circuitry on the integrated circuit. In this way, the pass gates that are controlled by the static output control signals from the memory elements will be overdriven and fully turned on. To avoid over-stressing gate oxides on the integrated circuit, it may be desirable to overdrive the pass gates using overdrive voltages that are as low as possible. For example, circuit blocks that contain critical signal paths may be overdriven at a higher voltage and circuit blocks that contain noncritical signal paths may be overdriven at a lower voltage. Programmable multiplexers can be used to selectively route a suitable overdrive voltage to the memory elements of each circuit block.

During fabrication, integrated circuits may be characterized. For example, measurements may be performed to determine the gate oxide thicknesses on the integrated circuits. The power supply voltages that are produced for the memory elements on an integrated circuit may be adjustable. If, for example, an integrated circuit has a relatively thick gate oxide, the overdrive voltages can be raised somewhat. If, the integrated circuit is determined to have a relatively thin gate oxide, the overdrive voltages can be lowered.

A logic design system may be used to assist a logic designer in producing configuration data that makes power supply adjustments and power supply voltage multiplexer adjustments when loaded into the memory elements on an integrated circuit.

The logic design system can automatically identify critical paths in a design (i.e., those paths in which signals must propagate with minimal signal delays). In the portions of an integrated circuit that contain the critical paths, a relatively high overdrive voltage (e.g., 1.3 volts) may be used for the memory element static output signals. In other portions of the integrated circuit, a smaller overdrive voltage may be used (e.g., 1.15 volts).

The logic design system may be provided with information on desired levels of reliability, power consumption, and performance. For example, the logic design system may be provided with a minimum specified level of overall reliability for the integrated circuit. By balancing the fraction of the design that uses high overdrive voltages with an appropriate compensating fraction of the design that uses lower overdrive voltages, the overall reliability target may be obtained, even when the high overdrive voltages exceed normal levels. If desired, multiple levels of overdrive voltage may be used. The desired performance for an integrated circuit may be characterized by a set of performance constraints (e.g., critical path timing constraints, timing constraints for various functional blocks on the circuit, overall timing constraints, etc.). As an example, the integrated circuit may be required to perform its intended logic function when using a clock of a particular speed. As when balancing overdrive voltage levels to attain a desired reliability target, the logic design system may balance the fraction of the design that uses high overdrive voltages (and thereby consumes more power per unit area) with an appropriate compensating fraction of the design that uses lower overdrive voltages (and thereby has a lower power density) to ensure that the desired performance (e.g., critical path timing, minimum clock speed, or other performance-based criteria) is attained.

By providing the logic design system with information on desired performance, reliability, and power consumption targets, the logic design system can produce configuration data that routes power supply voltages in a way that overdrives the circuitry in a design effectively without consuming more than the desired amount of power and while allowing desired reliability levels to be attained.

Further features of the invention, its nature and various advantages will be more apparent from the accompanying drawings and the following detailed description of the preferred embodiments.

DETAILED DESCRIPTION

Figure 1:
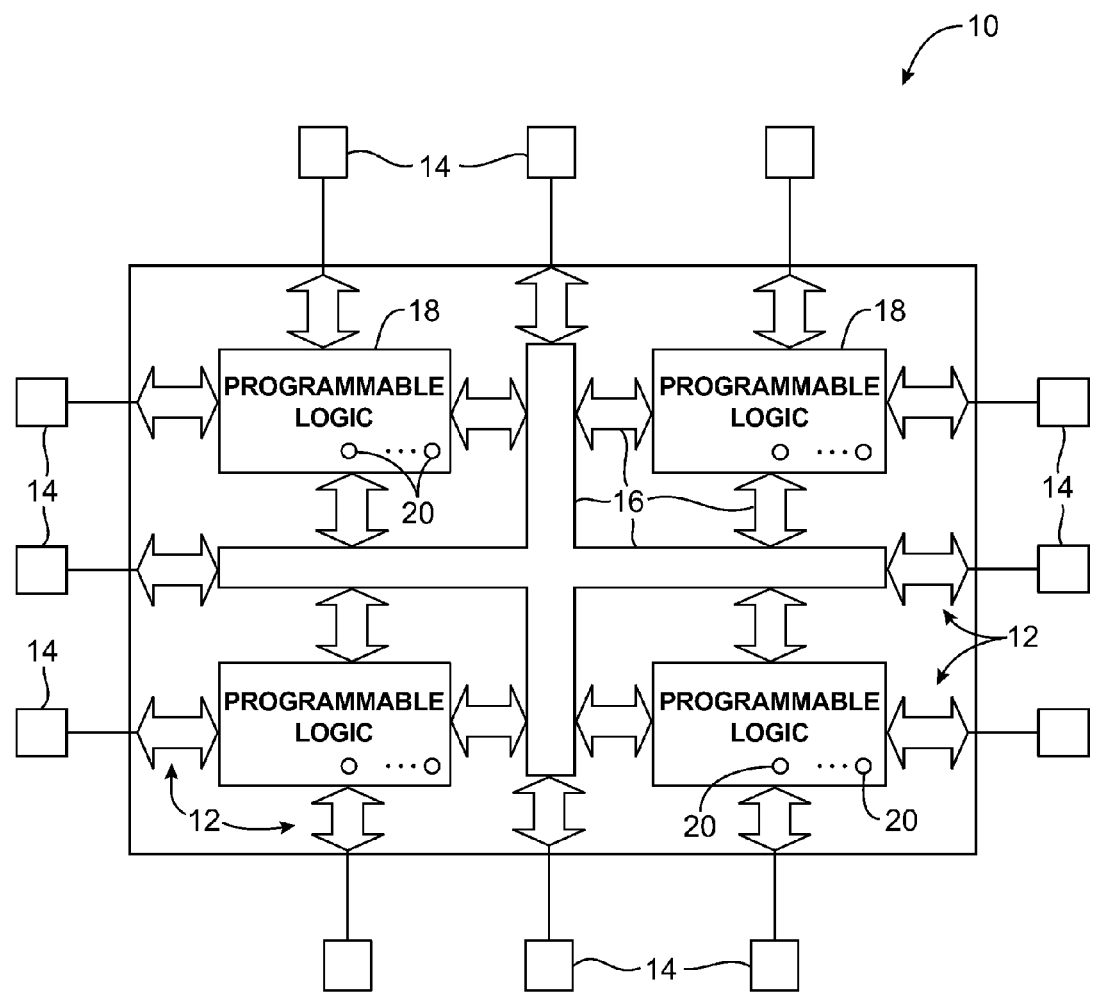
FIG. 1 is a diagram of an illustrative integrated circuit such as a programmable integrated circuit in accordance with an embodiment of the present invention.

Integrated circuits often contain nonvolatile and volatile memory elements. For example, integrated circuits may contain arrays of volatile memory elements such as random-access-memory cells. These integrated circuits may be memory chips, digital signal processing circuits, microprocessors, application specific integrated circuits, programmable integrated circuits such as programmable logic device integrated circuits or other circuits that include configurable circuitry, or other suitable integrated circuits.

In programmable integrated circuits, memory elements may be used to provide control signals for configuring programmable logic circuits. The memory elements may be powered using a positive power supply voltage and a ground power supply voltage.

The ground power supply voltage on an integrated circuit with memory elements is sometimes referred to as ground voltage Vss. Any suitable voltage level may be used as a ground voltage. For example, Vss may be 0 volts.

A number of different positive power supply voltages may be used on a given integrated circuit. For example, some portions of the device such as input-output circuits may be powered at a relatively high voltage such as 2.5 volts. This allows input-output buffers and other circuits in the input-output circuitry to interface with external circuitry. Other portions of the integrated circuit, such as the main centrally located logic on the device, may be powered at a lower voltage to conserve power. For example, the centrally located logic on the integrated circuit may be powered at a voltage Vcc of 0.85 volts.

Integrated circuit transistors are typically formed from a semiconductor such as silicon and have a gate, source, and drain. A gate insulator may be provided in the gate. The gate insulator may be formed from silicon oxide or high-K materials such as hafnium-based insulators (collectively referred to herein as gate insulators or gate oxides).

During device fabrication, the transistors in the regions of the integrated circuit that are powered at 2.5 volts such as input-output circuits may be fabricated with thicker gate oxides than the transistors in the regions of the integrated circuit that are powered at 0.85 volts. For example, the input-output circuit transistors may be fabricated with gate oxide thicknesses of about 35 angstroms (so-called "thick oxide" devices), while the central (core) logic may be fabricated with gate oxide thicknesses of 19 angstroms (so-called "thin oxide" devices). If desired, other types of transistors (i.e., transistors with intermediate oxide thicknesses) can be formed. To reduce cost and complexity, it may be desirable to avoid the need to provide these other types of transistors on a given integrated circuit.

The memory elements on the integrated circuit may be used to provide control signals for n-channel metal-oxide-semiconductor transistors (e.g., pass gates) and p-type metal-oxide-semiconductor transistors (e.g., power-down transistors). To ensure that pass gates perform properly, particularly in critical paths, it may be desirable to overdrive the transistors. For example, when it is desired to turn on a given n-channel transistor that is serving as a pass gate, it may be desirable to use a control voltage of about 1.2 volts. This value, which is elevated with respect to the normal data signal level of 0.85 volts (in this example), overdrives the pass gate and ensures that the pass gate does not introduce undesired signal losses or signal delays.

In devices such as programmable integrated circuits, overdrive signals such as these can be generated by memory elements. The memory elements can be powered at the elevated voltage level (e.g., 1.2 volts), so that their outputs are also provided at 1.2 volts (when loaded with a logic one) or 0 volts (when located with a logic zero).

To ensure satisfactory reliability for an integrated circuit, integrated circuit manufacturers avoid excessive overdrive voltages. For example, it may not be permissible with conventional overdrive arrangements to use a 1.3 volt overdrive voltage in an integrated circuit fabricated with a given process technology (i.e., a circuit fabricated according to particular set of design rules including gate oxide thicknesses, line widths, etc.). Because of these constraints, conventional integrated circuits cannot use overdrive voltages that are higher than predetermined limits.

This conventional restriction can be overcome by increasing the overdrive voltages that are used for only those portions of the integrated circuit that contain critical signal paths. Other portions of the integrated circuit can use lower overdrive voltages. For example, 1.3 volt overdrive voltages can be used where fast circuit performance is required to implement a user's circuit design, while 1.15 volt overdrive voltages can be used where slower circuit performance can be tolerated by the user's circuit design.

With this type of arrangement, satisfactory reliability performance can be maintained, even though the 1.3 volt overdrive voltages may exceed conventional limits (i.e., the 1.2 volt limit in this example). Reliability performance is not adversely affected, because device failure rates tend to track with the fraction (percentage) of transistor gate area that is powered at the overdrive voltage level. When only a portion of gates on an integrated circuit are exposed to the high overdrive voltage, the adverse impact of the elevated overdrive voltage level is reduced proportionally. Moreover, the remaining overdrive voltages can, if desired, be reduced somewhat (e.g., from 1.2 volts to 1.15 volts in this example), thereby mitigating any reliability performance degradation produced by the portion of the device that is overdriven at 1.3 volts.

In general, the overall reliability for a given integrated circuit is affected by the fraction of transistors that are overdriven at high overdrive levels versus the fraction of transistors that are overdriven at lower overdrive levels. Consider, as an example, a scenario in which it is desired to implement a design for an integrated circuit with a given overall reliability level, while minimizing power consumption and ensuring adequate performance. Nominal reliability considerations might dictate that none of the overdrive levels on the integrated circuit exceed a given bias level. The logic design system can, however, use higher overdrive levels in selective portions of the integrated circuit while maintaining the desired overall reliability level for the integrated circuit.

This can be accomplished by overdriving a first fraction of transistors on the integrated circuit at 1.3 volts (or other suitable voltage) while overdriving a second fraction of the transistors on the integrated circuit at 1.15 volts (or other suitable voltage). The 1.3 volt bias level is higher than would normally be used (in this example) and therefore results in a decreased reliability level for those transistors. Nevertheless, the 1.15 volt overdrive level more than compensates by resulting in greater than normal reliability levels. Because the overall reliability level for the integrated circuit is a weighted average of the individual reliability levels for each fraction of transistors, overall reliability can be maintained or improved by allowing the logic design system to intelligently allocate overdrive voltages among the transistors on the integrated circuit. If the overall reliability level is not being achieved, for example, the logic design system can assign the lower overdrive voltage (e.g., 1.15 volts) to a greater percentage of the transistors (i.e., the second fraction can be increased relative to the first fraction). This change in allocation will improve reliability and, when done appropriately, will not adversely affect critical paths.

The fraction of a design that uses overdrive voltages can also be adjusted to produce a desired power consumption level (i.e., to otherwise minimize power consumption) while attaining a desired performance target. A desired performance level may, for example, be specified by a set of timing constraints. The logic design system may, for example, be provided with a target clock speed at which an integrated circuit is to perform its intended logic function satisfactorily. Timing constraints may also be defined for particular portions of a design (e.g., certain paths in the design, etc.). Once the desired performance level has been set and a desired power consumption level has been defined, the logic design system can automatically ascertain what fraction of the circuit should use the overdrive voltage and what fraction of the circuit should use a lower voltage to compensate. The fraction of the circuit that is overdriven will tend to consume more power per unit area (i.e., it will exhibit an elevated power density), whereas the portion of the circuit that is driven with lower voltages will exhibit a reduced power density level. By striking an appropriate balance between these fractions (and more fractions if more overdrive levels are used), the logic design system can produce an optimal solution.

For clarity, the selective use of overdrive schemes such as this are sometimes described in the context of programmable integrated circuits. This is, however, merely illustrative. Any suitable integrated circuit may be provided with mixed overdrive voltages if desired.

An illustrative integrated circuit such as a programmable integrated circuit is shown in FIG. 1. Device 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 may include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Device 10 may contain programmable memory elements 20. Memory elements 20 can be loaded with configuration data (also called programming data) using pins 14 and input/output circuitry 12. Once loaded, the memory elements may each provide a corresponding static control output signal that controls the state of an associated logic component in programmable logic 18. The memory element output signals are typically applied to the gates of metal-oxide-semiconductor (MOS) transistors. These transistors may include n-channel metal-oxide-semiconductor (NMOS) pass transistors in programmable components such as multiplexers and logic array blocks (LABS).

When a memory element supplies a high output to an NMOS pass transistor, the transistor is turned on and passes logic signals from its input to its output. When the memory element output is low, the pass transistor is turned off and does not pass logic signals. Being able to configure pass transistors in this way allows the logic of the programmable logic device to be programmed to implement a desired logic design.

A typical memory element 20 is formed from a number of transistors configured to form cross-coupled inverters. With one suitable approach, complementary metal-oxide-semiconductor (CMOS) integrated circuit technology is used to form the memory elements 20, so CMOS-based memory element implementations are described herein as an example. In the context of programmable logic device integrated circuits, the memory elements store configuration data and are typically random-access-memory (RAM) elements. As a result, these programmable logic device memory elements are sometimes referred to as configuration random-access-memory (CRAM) cells. Other terms that are sometimes used to refer to memory elements 20 include terms such as memory cells, static random-access-memory elements or cells, RAM cells, RAM elements, CRAM cells, configuration elements, volatile memory elements, configuration bits, etc. In a typical modern programmable logic device, there may be millions of memory elements 20 on each chip.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
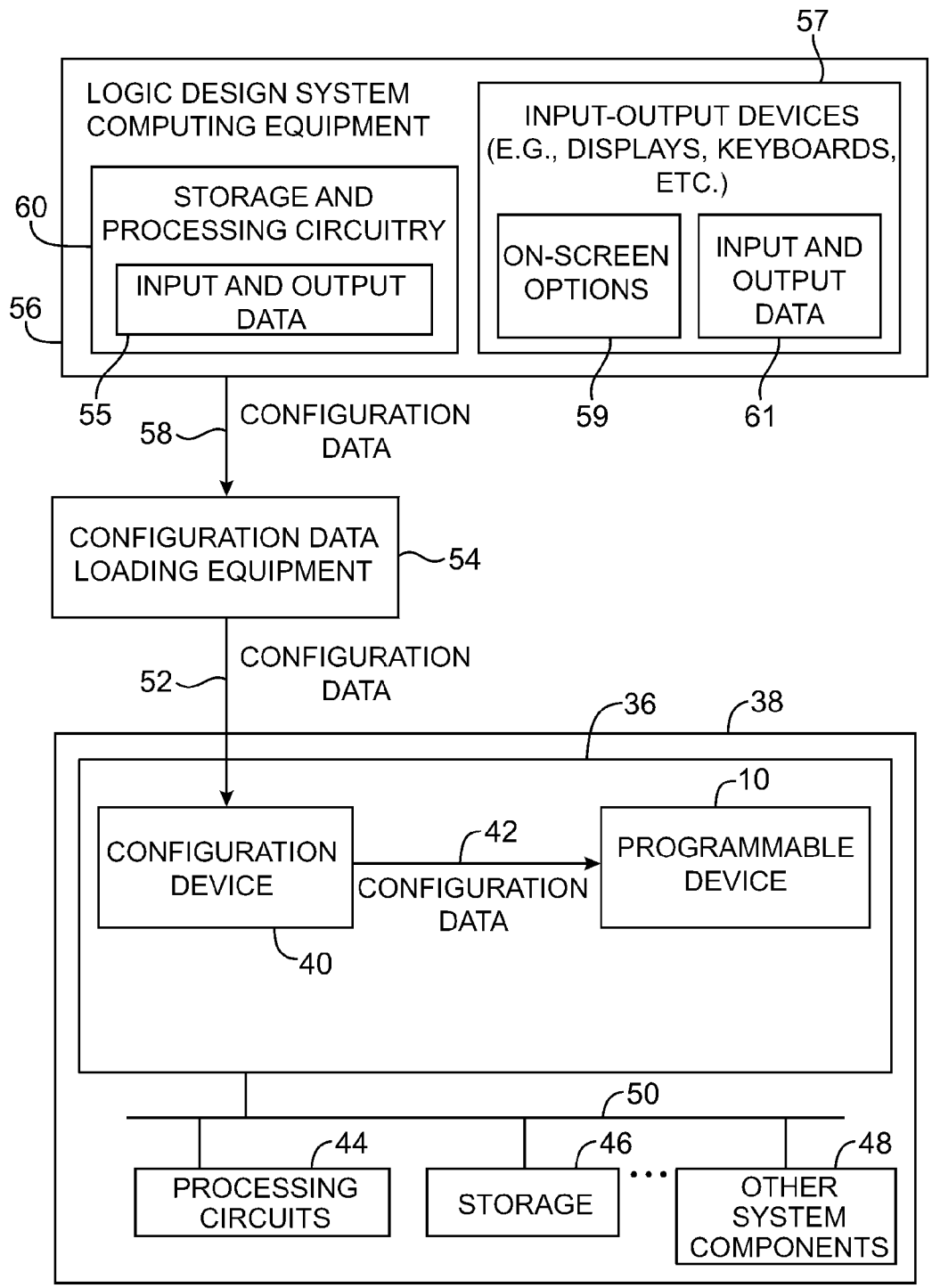
FIG. 2 is a diagram of a system including a programmable integrated circuit device and a circuit design system that may be used to generate configuration data for implementing custom circuit designs in the programmable device in accordance with an embodiment of the present invention.

An illustrative system environment for an integrated circuit such as a programmable integrated circuit is shown in FIG. 2. Integrated circuit 10 may be mounted on a board 36 in a system 38. Device 10 may receive programming data from programming equipment or from any other suitable equipment or device. In the example of FIG. 2, device 10 is the type of circuit that receives configuration data from an associated integrated circuit 40. With this type of arrangement, circuit 40 may, if desired, be mounted on the same board 36 as device 10. The circuit 40 may be an erasable-programmable read-only memory (EPROM) chip, a programmable integrated circuit configuration data loading chip with built-in memory (sometimes referred to as a configuration device), or any other suitable device. When system 38 boots up (or at another suitable time), the configuration data for configuring integrated circuit 10 may be supplied to integrated circuit 10 from device 40, as shown schematically by path 42. The configuration data that is supplied to integrated circuit 10 may be stored in circuit 10 in its programmable memory elements 20.

System 38 may include processing circuits 44, storage 46, and other system components 48 that communicate with integrated circuit 10. The components of system 38 may be located on one or more boards such as board 36 or other suitable mounting structures or housings and may be interconnected by buses and other electrical paths 50.

Configuration device 40 may be supplied with the configuration data for device 10 over a path such as path 52. Configuration device 40 may, for example, receive the configuration data from configuration data loading equipment 54 or other suitable equipment that stores this data in configuration device 40.

It can be a significant undertaking to design and implement a desired logic circuit in a programmable integrated circuit. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable integrated circuit.

As shown in FIG. 2, logic design system 56 may generate configuration data based on a user's design. The configuration data that is produced by a logic design system 56 may be provided to equipment 54 over a path such as path 58. Equipment 54 may, in turn, provide the configuration data to device 40, so that device 40 can later provide this configuration data to the programmable integrated circuit 10 over path 42. If desired, other programming arrangements may be used. The arrangement of FIG. 2 is merely illustrative.

Logic design system 56 may include processing circuitry and storage 60. Processing circuitry and storage 60 may be based on one or more processors such as personal computers, workstations, etc. The processor(s) may be linked using a network (e.g., a local or wide area network). Memory in these computers or external memory and storage devices such as internal and/or external hard disks may be used to store instructions and data. Storage in circuitry 60 may be organized to form shared and stand-alone databases. The stored information in the storage of storage and processing circuitry 60 may include input and output data 55. Input data may include, for example, settings selected by a user and library data. Output data may include modeling results, configuration data, reports, or any other suitable processed output from system 56.

In supporting design operations involved in implementing a desired custom logic function, the logic design system 56 may use software that runs on storage and processing circuitry 60. This software may take the form of one or more programs. When the programs are running on system 56, system 56 is sometimes referred to as a computer-aided design tool (or tools).

Input-output devices 57 may include input devices such as pointing devices and keyboards and may include output devices such as printers and displays. As shown in FIG. 2, system 56 may display on-screen options 59 on a display. The user may click on these on-screen options or may otherwise make selections based on displayed information. The user may also supply input by typing into text boxes, by performing drag and drop operations, using tabs, etc. Input-output data 61 may be displayed on a display or printed for a user. Input-output data 61 may include input data (e.g., data that a user has typed into a text box or has selected using a drop-down menu or other selectable option) and output data (e.g., modeling results, reports, information indicative of design choices, etc.).

During operation of logic design system computing equipment 56, executable software such as the software of computer aided design tools runs on the processor(s) of system 56. Databases and other storage may be used to store data for the operation of system 56. In general, software and data may be stored on any computer-readable medium (storage) in system 56. Such storage, which is shown schematically as storage 60 of FIG. 2, may include computer memory chips, removable and fixed media such as hard disk drives, flash memory, compact discs (CDs), DVDs, other optical media, and floppy diskettes, tapes, or any other suitable memory or storage device(s). When the software of system 56 is installed, the storage 60 of system 56 has instructions and data that cause the computing equipment in system 56 to execute various methods (processes). When performing these processes, the computing equipment is configured to implement the functions of the circuit design system.

The computer aided design (CAD) tools for system 56, some or all of which are sometimes referred to collectively as a CAD tool, may be provided by a single vendor or multiple vendors. These tools may be provided as one or more suites of tools (e.g., a compiler suite for performing tasks associated with implementing a circuit design in a programmable integrated circuit) and/or as one or more separate software components (tools). Databases in processing circuitry and storage 60 may include one or more databases that are accessed only by a particular tool or tools and may include one or more shared databases. Shared databases may be accessed by multiple tools. For example, a first tool may store data for a second tool in a shared database. The second tool can access the shared database to retrieve the data stored by the first tool. This allows one tool to pass information to another tool. Tools may also pass information between each other without storing information in a shared database if desired.

When a logic designer uses system 56 to implement a circuit, the logic designer is faced with a number of potentially challenging design decisions. The designer must balance factors such as cost, size, and performance to create a workable end product. Tradeoffs are involved. For example, a circuit of a given design can be implemented so that it operates quickly, but uses memory elements and pass gates with a relatively large overdrive voltage (e.g., 1.3 volts). The same circuit could also be implemented with lower overdrive voltages (e.g., 1.1 volts), but at reduced performance levels.

If desired, system 56 may be used in implementing a logic design using a mixture of different overdrive voltages. System 56 may, for example, automatically determine the locations of critical paths in a design. Critical paths must convey signals with fewer signal delays than noncritical paths. To ensure that the circuitry that is associated with the critical paths switches acceptably fast, system 56 may ensure that those portions of the circuitry on device 10 are overdriven at a relatively large overdrive voltage (e.g., 1.3 volts). To ensure acceptable reliability performance, the remaining noncritical portions of device may be implemented using a relatively smaller overdrive voltage (e.g., 1.15 volts). As a result of this balance between high and low overdrive voltage levels, adequate circuit switching speeds can be achieved while maintaining acceptable reliability. The portions of the circuit that are required to exhibit short delay times are provided with strongly overdriven pass gates. The portions of the circuit that can operate satisfactorily even when their pass gates are less strongly overdriven can be provided with reduced overdrive voltages.

By providing system 56 with adequate intelligence to consider power consumption, reliability, and performance, design criteria can be satisfied while making improvements to some or all of these factors. Consider, as an example, a design in which certain performance criteria and reliability criteria are fixed. In this type of environment, logic design system 56 can minimize power consumption by allocating the low overdrive voltage (1.15 volts) to as many blocks of transistors as possible.

As another example, consider a design in which it is desired to meet a given level of overall reliability for the integrated circuit. When transistors are overdriven at high levels their reliability level decreases. When transistors are overdriven at lower levels, reliability tends to increase. By allocating an appropriate first fraction of the transistors (i.e., at least those that lie in critical paths) to the high overdrive voltage regions on the circuit while allocating an appropriate second fraction of the transistors to the lower overdrive voltage regions, the desired overall reliability level for the integrated circuit can be attained, even if the higher overdrive level exceeds normally recommended upper limits. Because the fraction of transistors that are overdriven at high levels (i.e., the first fraction in this example) is limited by design system 56 and because the low overdrive voltage is low enough to enhance reliability for the second fraction of transistors, a desired overall reliability is maintained.

The computer aided design tools that are used in implementing this type of mixed overdrive voltage scheme may make automatic adjustments (i.e., to automatically determine appropriate overdrive voltage settings for a given design and to automatically produce an accompanying configuration data file). The computer aided design tools may also allow a user to make manual adjustments. These manual adjustments may involve user decisions to override system recommendations, user selections of preexisting circuit designs from a library, user selections from alternatives presented by the tools, etc.

A logic designer can use system 56 to make resource selections, placement decisions, and configuration random-access-memory element power supply adjustments to satisfy design constraints such as desired timing margins while minimizing pass gate stress by reducing overdrive levels where possible. For clarity, functions associated with selecting appropriate overdrive voltage levels are sometimes described in the context of logic design system 56 and associated CAD tools. In general, any suitable number of software components (e.g., one or more tools) may be used to provide a circuit designer with overdrive voltage settings selection assistance. These software components may be separate from logic compilers, place-and-route tools and other software or some or all of the software components that provide overdrive voltage selection assistance functionality may be provided within logic synthesis and optimization tools, a place-and-route tool, etc.

Figure 3:
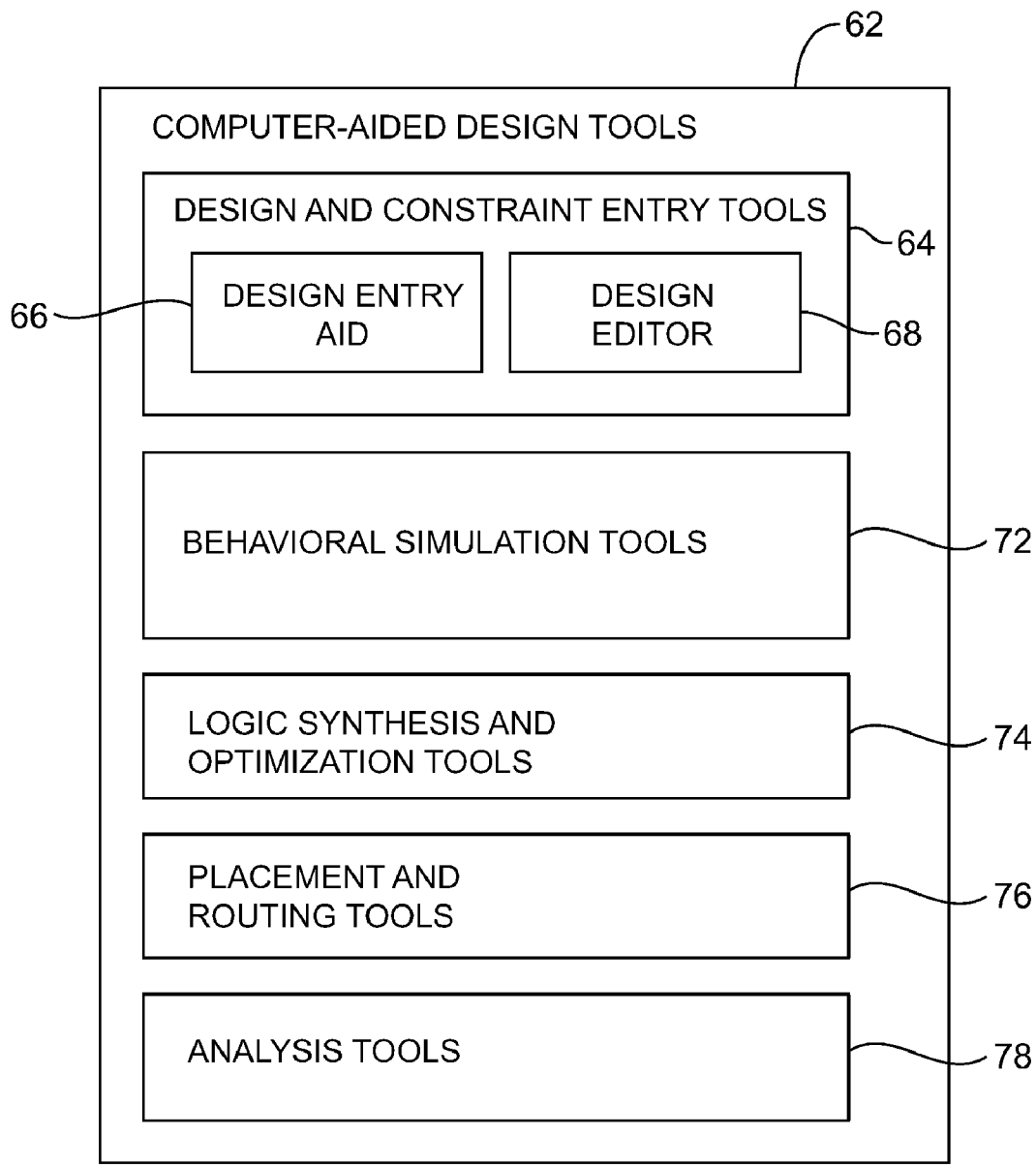
FIG. 3 is a diagram of illustrative computer-aided design (CAD) tools that may be used in a logic design system in accordance with an embodiment of the present invention.

Illustrative computer aided design tools 62 that may be used in a logic design system such as system 56 of FIG. 2 shown in FIG. 3.

The design process typically starts with the formulation of logic circuit functional specifications. A logic designer can specify how a desired circuit should function using design and constraint entry tools 64. Design and constraint entry tools 64 may include tools such as design and constraint entry aid 66 and design editor 68. Design and constraint entry aids such as aid 66 may be used to help a logic designer locate a desired design from a library of existing logic designs and may provide computer-aided assistance to the logic designer for entering (specifying) the desired design. As an example, design and constraint entry aid 66 may be used to present screens of options for a user. The user may click on on-screen options to select whether the circuit being designed should have certain features. Design editor 68 may be used to enter a design (e.g., by entering lines of hardware description language code), may be used to edit a design obtained from a library (e.g., using a design and constraint entry aid), or may assist a user in selecting and editing appropriate prepackaged code/designs.

Design and constraint entry tools 64 may be used to allow a logic designer to provide a desired logic design using any suitable format. For example, design and constraint entry tools 64 may include tools that allow the logic designer to enter a logic design using truth tables. Truth tables can be specified using text files or timing diagrams and may be imported from a library. Truth table logic design and constraint entry may be used for a portion of a large circuit or for an entire circuit.

As another example, design and constraint entry tools 64 may include a schematic capture tool. A schematic capture tool may allow the logic designer to visually construct logic circuits from constituent parts such as logic gates and groups of logic gates. Libraries of preexisting logic circuits may be used to allow a desired portion of a design to be imported with the schematic capture tools.

If desired, design and constraint entry tools 64 may allow the logic designer to provide a logic design to the logic design system 10 using a hardware description language such as Verilog hardware description language (HDL) or Very High Speed Integrated Circuit Hardware Description Language (VHDL). The designer of the logic circuit can enter the logic design by writing hardware description language code with editor 68. Blocks of code may be imported from user-maintained or commercial libraries if desired.

After the design has been entered using design and constraint entry tools 64, behavioral simulation tools 72 may be used to simulate the functional performance of the design. If the functional performance of the design is incomplete or incorrect, the logic designer can make changes to the design using design and constraint entry tools 64. The functional operation of the new design can be verified using behavioral simulation tools 72 before synthesis operations have been performed using tools 74. Simulation tools such as tools 72 may also be used at other stages in the design flow if desired (e.g., after logic synthesis). The output of the behavioral simulation tools 72 may be provided to the logic designer in any suitable format (e.g., truth tables, timing diagrams, etc.).

Once the functional operation of the logic design has been determined to be satisfactory, logic synthesis and optimization tools 74 may be used to implement the logic design in a particular programmable integrated circuit (i.e., in the logic and interconnect resources of a particular programmable integrated circuit product or product family).

Tools 74 attempt to optimize the design by making appropriate selections of hardware to implement different logic functions in the logic design based on the logic design data and constraint data entered by the logic designer using tools 64.

After logic synthesis and optimization using tools 74, the logic design system may use tools such as placement and routing tools 76 to perform physical design steps (layout synthesis operations). Placement and routing tools 76 are used to determine how to place the circuits for each logic function within the programmable logic device. For example, if two counters interact with each other, the placement and routing tools 76 may locate these counters in adjacent logic regions on the programmable integrated circuit to minimize interconnect delays. The placement and routing tools 76 create orderly and efficient implementations of logic designs for a given programmable integrated circuit.

Tools such as tools 74 and 76 may be part of a compiler suite (e.g., part of a suite of compiler tools provided by a programmable integrated circuit vendor). Tools such as tools 74 and 76 manually and automatically take into account the effects of using different memory element power supply levels in different regions of an integrated circuit while implementing a desired circuit design. This allows tools 74 and 76 to satisfy design constraints while minimizing the overdrive voltages that are used in the circuit.

After an implementation of the desired logic design in the programmable integrated circuit has been generated using placement and routing tools 76, the implementation of the design may be analyzed and tested using analysis tools 78. After satisfactory optimization operations have been completed using tools 62, tools 62 can produce the configuration data for the programmable integrated circuit. In mask programmable integrated circuits, configuration data may be embodied in mask designs (e.g., masks for producing patterns of via connections that serve to program elements 20 on a given mask-programmed integrated circuit).

When using tools 62, an initial netlist may be synthesized to produce a post-synthesis netlist. User input and the post synthesis netlist may then be processed during place and route and optimization operations. During these operations, CAD tools 62 may take account of the effects of using different overdrive voltages in different circuit blocks and, through appropriate selection of memory element power supply levels, circuit resource assignments, and placement decisions, tools 62 can limit the use of larger overdrive voltages while still satisfying design constraints. The resulting netlist that is produce by tools 62 may be processed further during an assembly process to produce a configuration data file output 94 (e.g., a .pof or .sof file).

CAD tools 62 can automatically identify appropriate overdrive levels to be used for different memory elements 20. These overdrive levels may, if desired, by used on a block-by-block basis or using other suitable levels of granularity. With high-granularity architectures, highly-localized adjustments may be made. As an example, adjustments may be made on a multiplexer-by-multiplexer basis. With this type of arrangement, the memory elements in each multiplexer are grouped together and are powered using a common memory element power supply level. Some multiplexers are operated in fast mode and are powered using a higher voltage (e.g., 1.3 volts), whereas other multiplexers are operated in slow mode and are powered using a lower voltage (e.g., 1.15 volts). In less granular architectures, adjustments may be made on a logic-array-block (LAB) basis. With this type of arrangement, the memory elements in some circuit blocks may be powered using higher voltages whereas the memory elements in other circuit blocks may be powered using lower voltages. More granular architectures allow for greater design flexibility, but may require a relatively larger amount of resource overhead. Less granular architectures will tend to be less complex at the expense of reduced flexibility.

Figure 4:
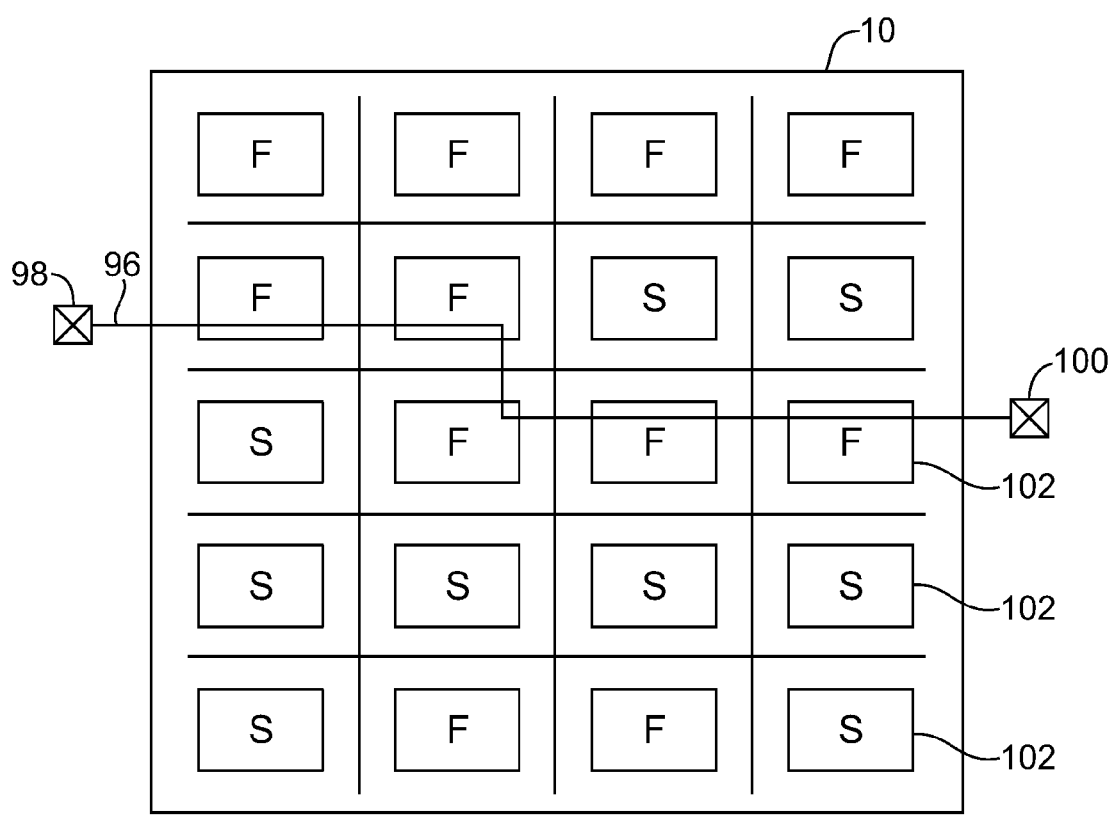
FIG. 4 is a diagram of an illustrative integrated circuit showing how circuit blocks along a critical signal path can be configured to operate in a fast mode while other circuit blocks are configured to operate in a slow mode in accordance with an embodiment of the present invention.

An illustrative integrated circuit that contains adjustable memory element power supplies is shown in FIG. 4. In the example of FIG. 4, a logic designer's desired custom circuit design contains a critical path 96. Signals on path 96 must flow from input 98 to output 100 as fast as possible.

The circuit 10 of FIG. 4 contains rows and columns of circuit blocks 102. Some of the circuit blocks 102 contain memory elements that are powered using relatively higher power supply settings (e.g., a Vcchg value of 1.3 volts and a Vss value of 0 volts). These blocks are labeled "F" to indicate that their circuitry operates relatively rapidly (fast mode). Other blocks 102 contain memory elements that are powered using relatively lower voltages (e.g., a Vcchg value of 1.15 volts and a Vss value of 0 volts). These blocks operate in a lower-power slower speed regime and are therefore labeled "S" to indicate that their circuitry operates relatively slower (slow mode).

To ensure that the signals on critical path 96 are not unnecessarily slowed by low-power, low-speed circuitry, the memory element power supply settings are adjusted so that path 96 only traverses regions of circuitry that are operating in fast mode (the "F" blocks in FIG. 4). Path 96 avoids the slow blocks S. To reduce gate oxide stress in the transistors on circuit 10 as much as possible while satisfying the timing constraints associated with the logic designer's custom circuit, it may be desirable to place most or all of the blocks 102 that do not contain path 96 into slow mode.

The example of FIG. 4 is simplified. In general, there are thousands or millions of signal paths on a given programmable logic device. Each of these signal paths has associated timing constraints. To reduce power consumption while satisfying performance criteria, the logic design system 56 is used to help determine which regions of circuitry should be placed in slow mode and which regions of circuitry should be placed in fast mode. There may also be more modes (e.g., a medium speed mode, or more than one intermediate speed modes each of which has an associated intermediate overdrive voltage level).

For example, there may be three or more different overdrive levels, four or more different overdrive levels, or five or more overdrive levels. Logic design system 56 can allocate overdrive levels as needed to ensure that performance criteria are met. For example, a particular circuit may require an intermediate switching speed. To ensure that this intermediate level of performance is attained without driving the transistors in this circuit too strongly, logic design system can generate configuration data that allocates an intermediate level of overdrive voltage to the circuit.

Figure 5:
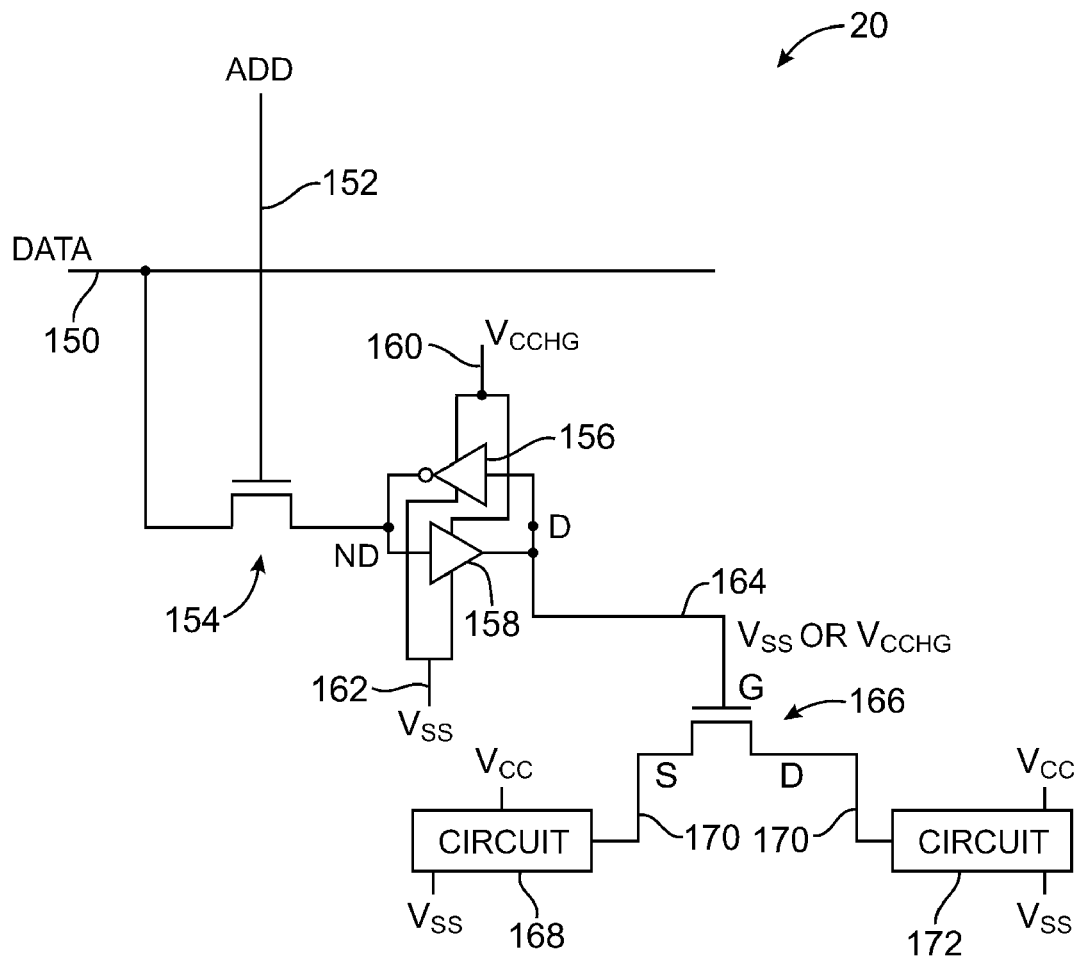
FIG. 5 is a diagram of an illustrative memory element that may be powered at a selectable power supply voltage in accordance with an embodiment of the present invention.

The circuitry of an illustrative memory element 20 is shown in FIG. 5. The example of FIG. 5 uses a single address line and a single data line and uses a bistable element formed from a pair of cross-coupled inverters 156 and 158. This is merely illustrative. In general, memory elements 20 may be formed using any suitable architecture. The use of the arrangement of FIG. 5 is shown as an example.

As shown in FIG. 5, memory element 20 may contain two cross-coupled inverters 156 and 158. Each inverter may contain a p-channel metal-oxide-semiconductor transistor and an n-channel metal-oxide-semiconductor transistor connected in series between positive power supply terminal 160 and ground power supply terminal 162. The input of inverter 158 is connected to complement data node ND and has an output connected to true data node D. Inverter 156 has its input connected to node D and its output connected to node ND. Address transistor 154 is controlled by address signal ADD on address line 152. Data line 150 is connected to node ND via address transistor 154. Data line 150 may be used to load data into memory element 20 during write operations and may be used to convey data from memory element 20 to associated reading circuitry during data read operations.

During read and write operations, address signal ADD is asserted. This turns on address transistor 154. In data write operations, complementary data (NDATA) from line 150 is driven onto node ND. If a logic one is driven onto node ND, memory element 20 will be loaded with a logic zero and data node D will be low (at Vss). If a logic zero is driven onto node ND, memory element 20 will be loaded with a logic one and data node D will be high (at Vcchg).

Once loaded with a configuration data bit, memory element 20 may supply a corresponding high or low static control signal to an associated programmable logic transistor such as transistor 166 using a path such as path 164. If the value of D on gate G of transistor 166 is low, transistor 166 will be turned off. In this situation, source S and drain D of transistor 166 will be isolated from each other and no signals will pass from circuit 168 to circuit 172. If the value of D on gate G of transistor 166 is high, transistor 166 will turn on, shorting paths 170 to each other. This allows signals from circuit 168 to pass to circuit 172 via paths 170 and transistor 166.

Memory elements such as element 20 are arranged in an array on integrated circuit 10. In a typical arrangement, there are thousands or millions of elements 20 on a given integrated circuit 10. The memory elements 20 in the array form rows and columns. Address lines 152 and data lines 150 may be associated with different rows and columns of elements in the array and may be used to control read and write operations for the elements.

Memory element 20 is powered using a positive power supply voltage Vcchg and a ground power supply voltage Vss. The positive power supply voltage Vcchg is applied to terminal 160. The ground power supply voltage Vss is applied to terminal 162. The magnitude of the memory element output signal that is provided on line 164 as an overdrive signal for transistor 166 is a function of the data bit value stored in the memory element 20 and the size of the power supply voltage Vcchg that has been supplied to terminal 160. As an example, consider a memory element 20 in which a logic one has been stored. If this cell is powered using a positive power supply voltage Vcchg of 1.3 volts, the output signal on line 164 will be 1.3 volts. If, however, the same element is powered using voltage Vcchg of 1.15 volts, the output signal voltage will be 1.15 volts. Cells loaded with zeros will supply Vss to gate G (e.g., at 0 volts).

Figure 6:
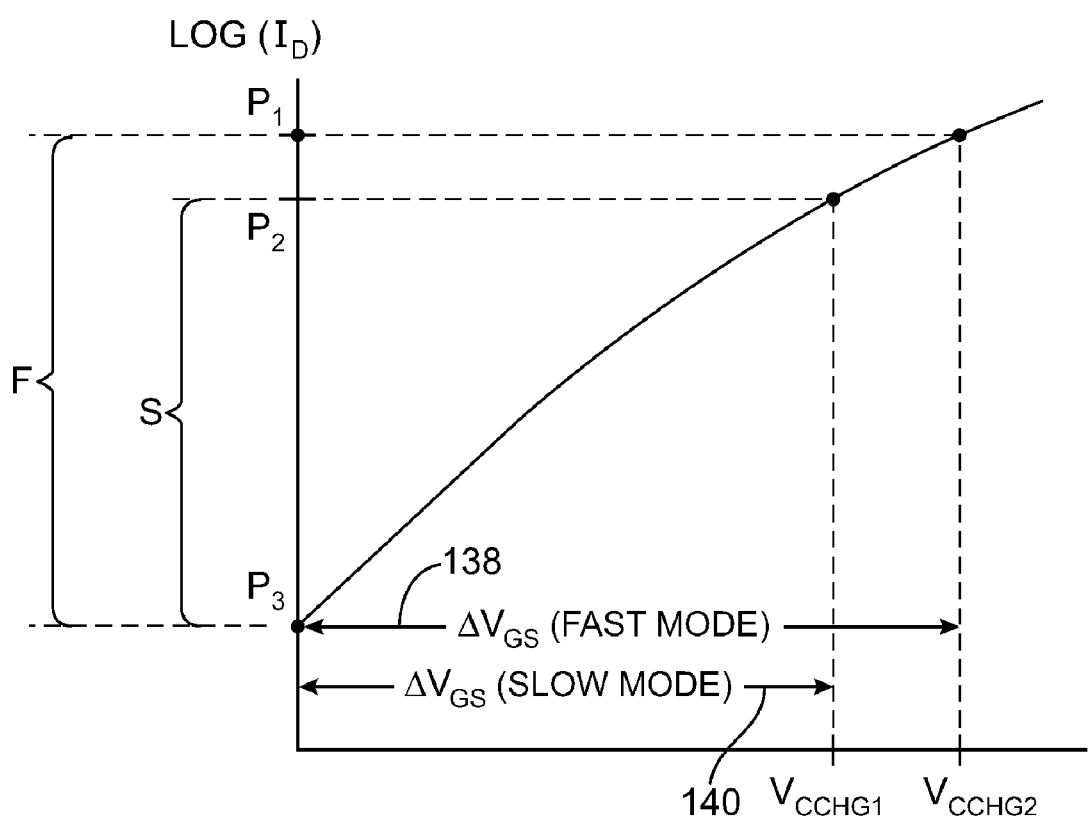
FIG. 6 is a graph that shows the amount of drain current that flows through a pass transistor as a function of applied gate voltage and that shows the impact of using different power supply settings for the configuration random-access-memory cell that controls the pass transistor in accordance with an embodiment of the present invention.

The value of the memory element output signal on line 164 affects the performance of the transistor that the memory element is controlling (i.e., n-channel pass transistor 166 in the example of FIG. 5). The graph of FIG. 6 shows the impact of using different Vcchg settings on the performance of transistor 166. In the FIG. 6 graph, the logarithm of the drain-source current log(Id) for transistor 166 is plotted as a function of applied voltage on gate G (i.e., as a function of gate-to-source voltage Vgs). If the gate voltage is 1.3 volts, the transistor 166 operates at point P1. If the gate voltage is 1.15 volts, the transistor operates at point P2. The gate voltage may be taken to 0 volts (point P3) when it is desired to turn off transistor 166.

The on/off performance of transistor 166 is given by the ratio of the on current of the transistor to its off current. As shown in FIG. 6, the on/off performance of the transistor 166 when operating with control voltages of 1.3 volts and 0 volts is given by the ratio of point $P_1$ to point $P_3$. This on/off ratio is obtained when the memory element associated with transistor 166 is powered using Vcchg and Vss voltages of 1.3 volts and 0 volts, respectively. The on/off performance of the transistor 166 when operating with control voltages of 1.15 volts and 0 volts is given by the ratio of point $P_2$ to point $P_1$. This somewhat lower on/off ratio is obtained when the associated memory element 20 is powered using Vcchg and Vss voltages of 1.15 volts and 0 volts, respectively.

Because the Vcchg level of 1.3 volts is larger than typical power supply voltages for the normal data processing circuits on integrated circuit 10 (which are generally about 0.85 volts in this example), the use of the 1.3 volt Vcchg level is said to be an "overdrive" voltage. The use of the overdrive voltage to turn on transistor 166 helps to reduce the resistance of transistor 166. Because Id is large in this situation, the transistor 166 is capable of rapidly charging parasitic capacitances and helps the circuit of which it is a part to operate at high speed. The Vcchg and Vss settings of 1.3 volts and 0 volts are therefore said to be "fast mode" settings. The range of gate voltages used for transistor 166 in fast mode is shown by line 138.

When the lower range of gate voltages is used, the gate voltages for the transistor 166 fall within the limits shown by line 140. Vcchg in this scenario is 1.15 volts, which helps to overdrive the transistor 166, although not as strongly as when a Vcchg value of 1.3 volts is used. Vss is 0 volts, so the on-off ratio for the slow mode transistors is less than with the fast mode transistors (i.e., the Vgs range is reduced). Nevertheless, the use of the lower overdrive voltage of 1.15 volts wherever possible without violating design constraints helps to improve reliability by reducing gate oxide stress.

Figure 7:
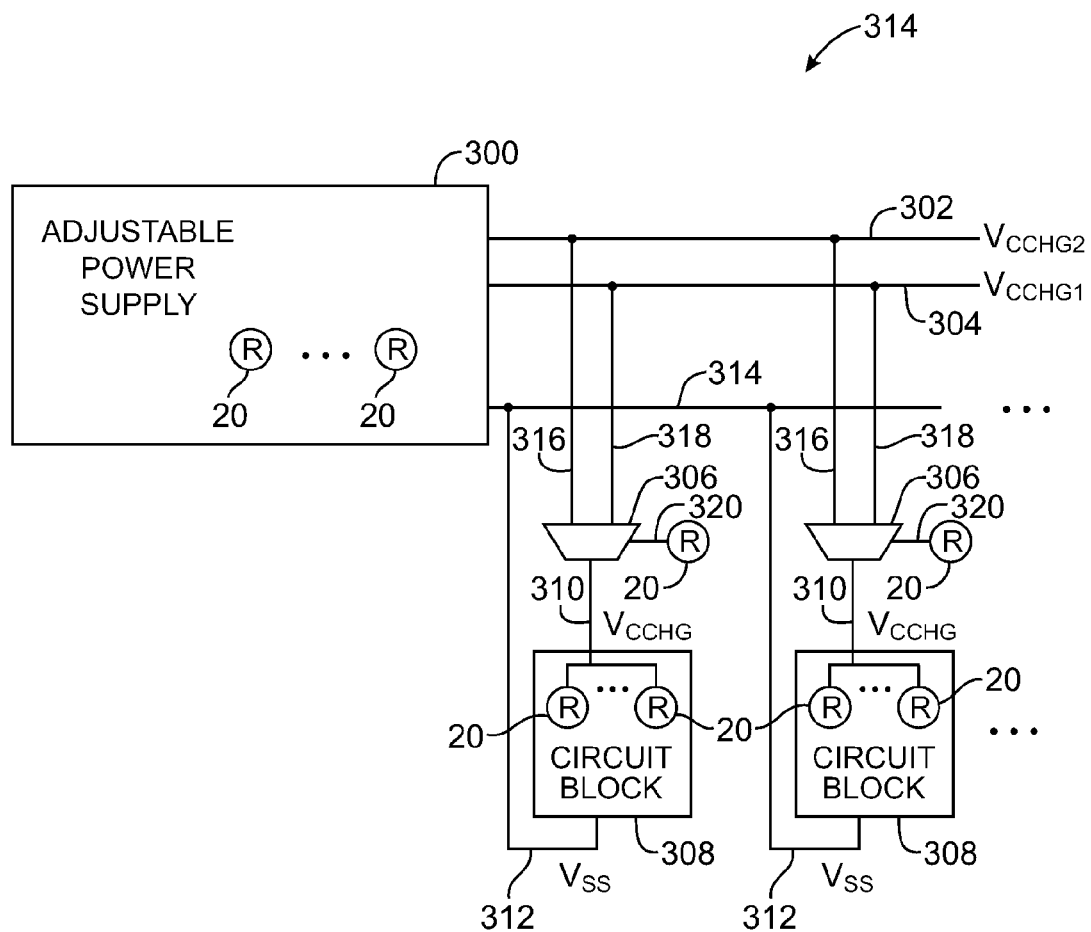
FIG. 7 is a diagram of illustrative circuitry on an integrated circuit that includes an adjustable memory element power supply in accordance with an embodiment of the present invention.

Power supply circuitry 314 that may be used in distributing different overdrive voltages to different portions of integrated circuit 10 in accordance with settings produced by logic design system 56 is shown in FIG. 7. As shown in FIG. 7, integrated circuit 10 may have one or more power supply circuits such as adjustable power supply 300. Adjustable power supply 300 may be powered using externally supplied voltages (e.g., voltages obtained from pins 12 or derived from voltages on pins 12).

Adjustable power supply 300 may supply multiple overdrive voltages such as voltages Vcchg1 (e.g., 1.15 volts) and Vcchg2 (e.g., 1.3 volts) and a ground voltage Vss (e.g., 0 volts) at its outputs. Adjustable power supply 300 may be adjusted by control signals that are supplied from internal and/or external control circuitry and/or by control signals from memory elements 20. These control signals may be used to adjust the magnitude of voltages Vcchg1 and Vcchg2.

For example, if it is determined from test measurements or other characterizing measurements that the gate oxides on a given integrated circuit are somewhat larger than a nominal expected oxide thickness, it can be concluded that the given integrated circuit will be better able to withstand higher overdrive voltages than expected. In this situation, the integrated circuit can be allocated to a high performance "bin" and, when used, configuration bits for the memory elements 20 of power supply 300 may direct power supply 300 to supply a Vcchg1 value of 1.2 volts (instead of 1.15 volts) and a Vcchg2 value of 1.35 volts (rather than 1.3 volts). Circuits with lower-than average gate oxide thicknesses may be allocated to a lower performance bin and can be provided with reduced values of Vcchg1 and Vcchg2 (e.g., 1.1 volts and 1.25 volts). There may be any suitable number of adjustable steps available for these voltage adjustments (e.g., supply 300 may be produce two, three, four, five, or more than five different selectable levels for each of Vcchg1 and Vcchg2 if desired). Moreover, circuit complexity can be reduced by implementing power supply 300 using a fixed voltage arrangement (i.e., a circuit that does not contain programmable elements 20 and that produces predetermined fixed values of Vcchg1 and Vcchg2).

Ground voltage Vss and positive power supply voltages Vcchg1 and Vcchg2 may be distributed using power distribution paths such as paths 302, 304, and 314. Ground voltage Vss may be supplied to each of multiple circuit blocks 308 using ground distribution path 314 and local ground distribution paths 312.

Positive power supply voltages Vcchg1 and Vcchg2 may be distributed to inputs 316 and 318 of power supply voltage selection multiplexers 306. Each multiplexer 306 may have an output 310 to which a selected one of inputs 316 and 318 is connected in accordance with a control signal on that multiplexer's control input 320. The control signals on control inputs 320 may be supplied from corresponding programmable elements 20. When the control signal to a given multiplexer 306 has one logic value (e.g., a logic high), the output Vcchg for that multiplexer will be Vcchg2, whereas the output Vcchg for the multiplexer will be Vcchg1 when the control signal has the complementary logic value (e.g., a logic zero).

Each circuit block 308 may have a set of associated programmable elements 20 that are powered by the selected value of Vcchg for that block. When loaded with logic ones, these programmable elements produce output signals D at an overdrive voltage that is equal to the selected value of Vcchg. By adjusting the memory elements 20 that control multiplexers 306, some circuit blocks 308 may have their pass gates overdriven at Vcchg2 for fast mode operation and other circuit blocks 308 may have their pass gates overdriven at Vcchg1 for slow mode operation (as with blocks 102 in the example of FIG. 4).

The programmable elements 20 that are used in adjusting supply 300 and multiplexers 306 may themselves be powered at any suitable voltage (e.g., Vcchg2, Vcchg1, etc.).

Figure 8:
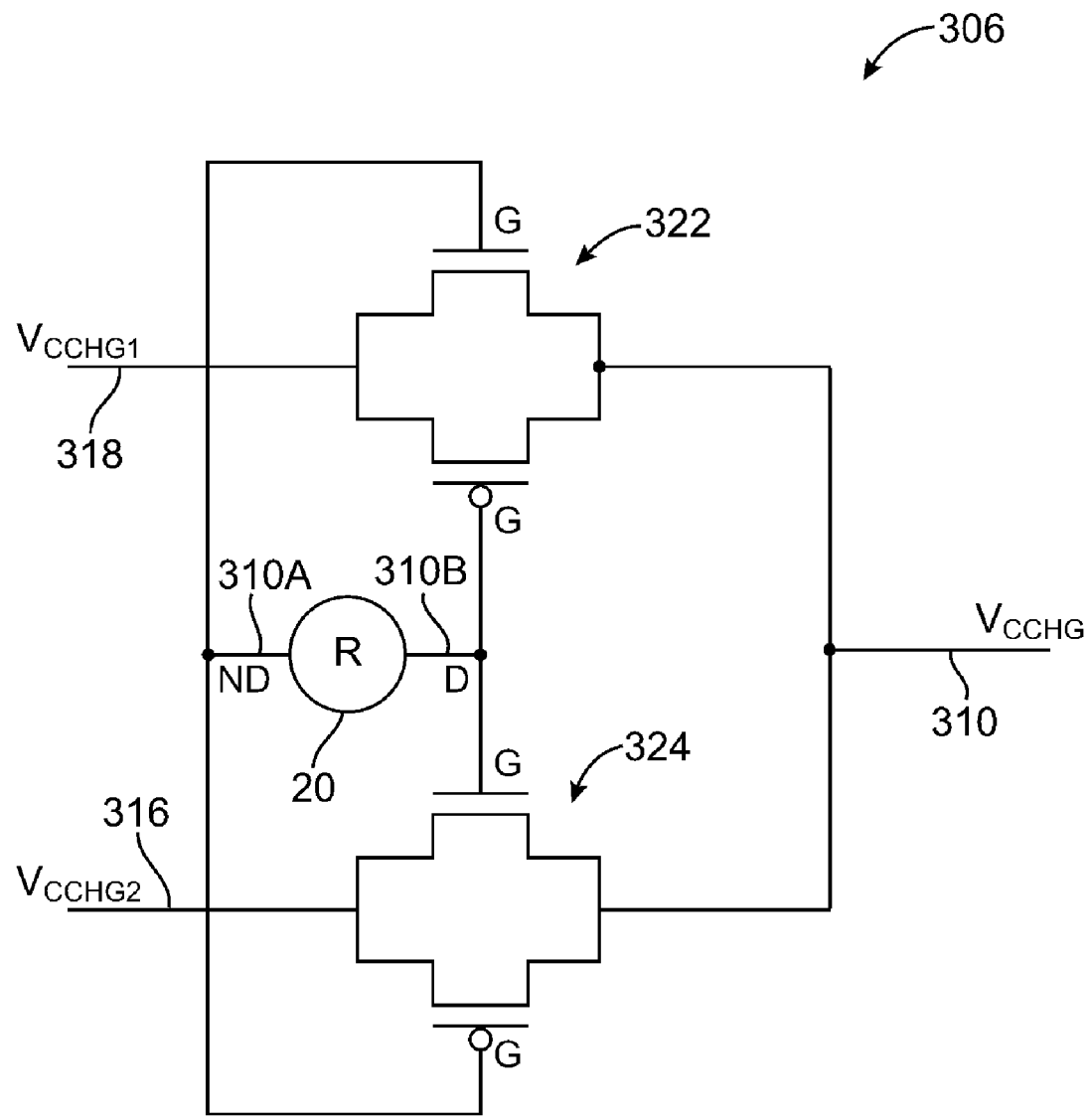
FIG. 8 is a diagram of an illustrative power supply voltage selection switch based on a programmable multiplexer that may be used in accordance with an embodiment of the present invention.

An illustrative circuit that may be used for each memory element power supply voltage selection multiplexer 306 is shown in FIG. 8. As shown in FIG. 8, multiplexer 306 may be formed form CMOS pass gate 322 and CMOS pass gate 324 using the true (D) and complement (ND) outputs of a given programmable element 20. When D is high and ND is low, pass gate 324 will be turned on and Vcchg on output 310 will be equal to Vcchg2 on input 316. When D is low and ND is high, CMOS pass gate 322 will be turned on, thereby connecting input 318 to output 310 and taking Vcchg on output 310 to Vcchg1.

Figure 9:
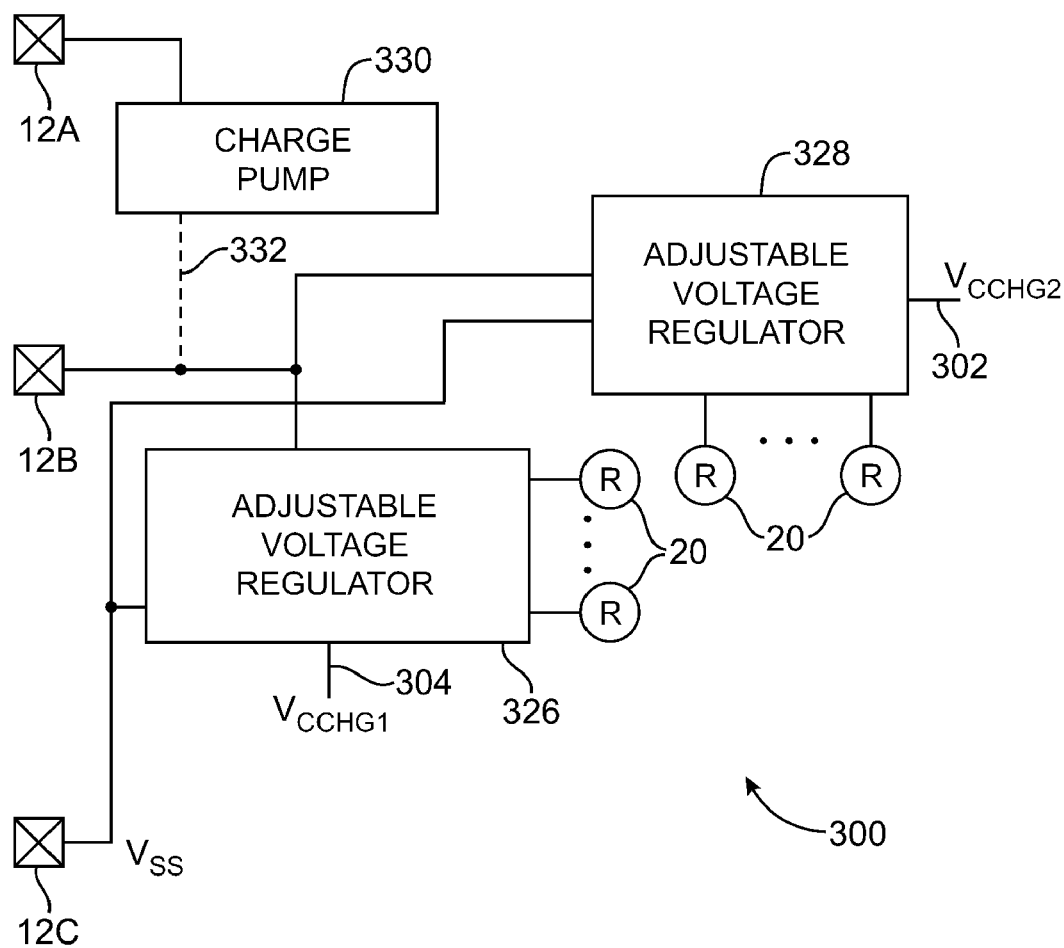
FIG. 9 is a diagram of illustrative power supply circuitry that may be used to supply a number of individually adjustable positive power supply voltages for the inputs of a power supply voltage selection switch of the type shown in FIG. 8 in accordance with an embodiment of the present invention.

An illustrative circuit that may be used for adjustable power supply 300 is shown in FIG. 9. As shown in FIG. 9, adjustable power supply 300 may have a first voltage regulator such as voltage regulator 326 that produces a regulated and adjustable output voltage Vcchg1 on output 304 in accordance with voltage adjustment settings provided by associated programmable elements 20. Power supply 300 may also have a second adjustable voltage regulator 328 that supplies a regulated and adjustable output voltage Vcchg2 on output 302 in accordance with voltage adjustment settings provided by its associated programmable elements 20. If desired, voltage regulators 326 and 328 may be implemented using fixed (nonadjustable) regulator circuits and the associated memory elements 20 may be omitted to reduce complexity. The arrangement of FIG. 9 may be used to allow circuits to be individually adjusted (e.g., to support a binning scheme in which different parts are supplied with different amounts of overdrive voltage in accordance with their ability to reliably withstand that amount of overdrive voltage).

Power may be supplied to adjustable voltage regulators 326 and 328 using ground power supply pin 12C and positive power supply pin 12B. Positive power supply voltages for regulators 326 and 328 may also be provided using internal sources. For example, an external supply voltage (e.g., at 0.85 volts) may be supplied to charge pump 330 using power supply pin 12A. Charge pump 330 may boost this power supply voltage to a higher voltage (e.g., to 1.3 or 1.4 volts). This boosted voltage may then be routed to adjustable voltage regulators 326 and 328 using paths such as path 332. Voltage regulators 326 and 328 may then derive Vcchg1 and Vcchg2 from the boosted voltage.

Figure 10:
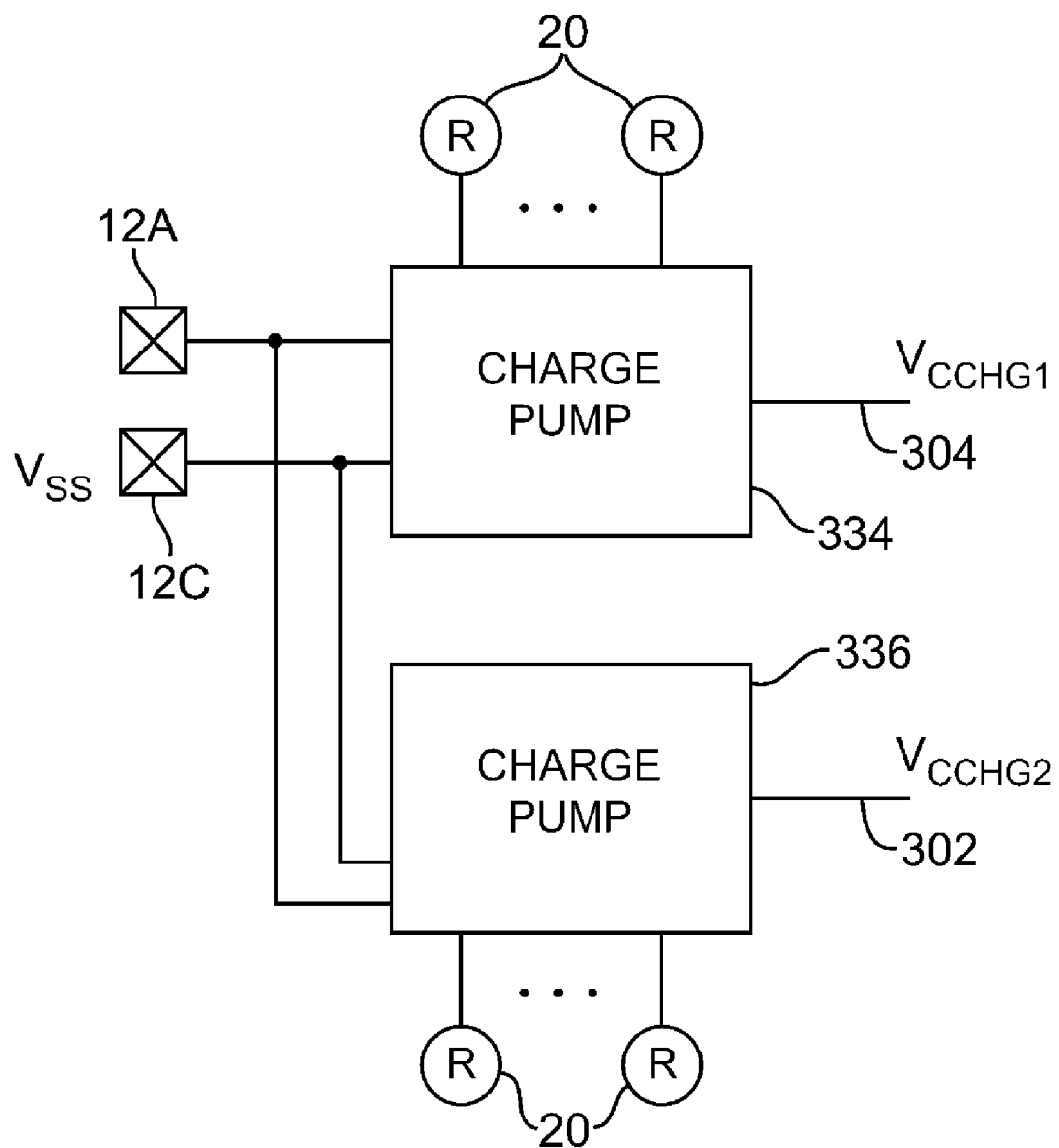
FIG. 10 is a diagram of another illustrative power supply circuit that may be used to supply a number of individually adjustable positive power supply voltages for the inputs of a power supply voltage selection switch of the type shown in FIG. 8 in accordance with an embodiment of the present invention.

Another illustrative power supply circuit that may be used for adjustable power supply 300 is shown in FIG. 10. As shown in FIG. 10, power supply 300 may have adjustable charge pump circuits such as adjustable charge pumps 334 and 336. Charge pumps 334 and 336 may receive a positive power supply voltage from a source such as pin 12A (e.g., at 0.85 volts) and may produce correspondingly boosted output voltages at outputs 304 and 302, respectively. If desired, charge pumps 334 and 336 may be fixed charge pumps. The use of memory elements 20 to supply control signals to charge pumps 334 and 336 allows the magnitudes of Vcchg1 and Vcchg2 to be adjusted to higher or lower values as appropriate (e.g., based on characterizing measurements performed during manufacturing).

Figure 11:
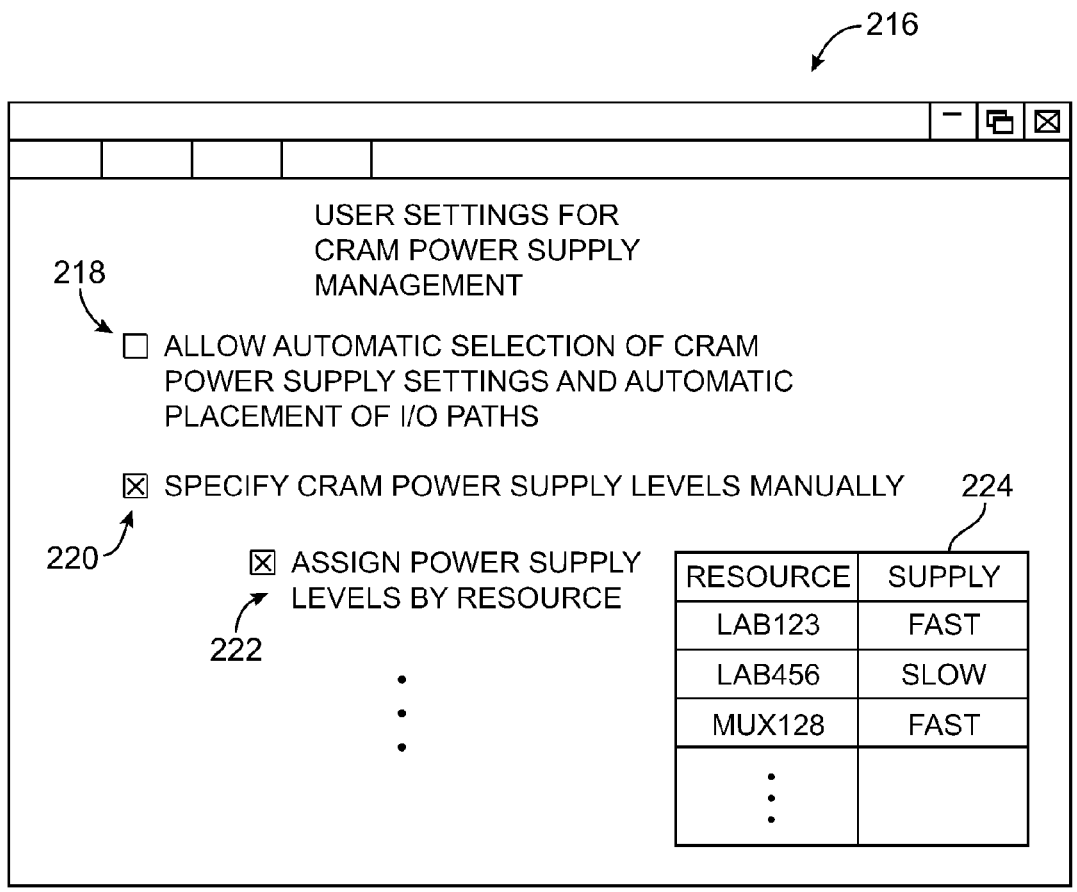
FIG. 11 is an illustrative settings screen that a logic design tool can provide to a user to allow adjustment of configuration random-access-memory power supply settings for the tool in accordance with an embodiment of the present invention.

An illustrative settings screen 216 that may be presented to a logic designer by logic design system 56 using CAD tools 62 is shown in FIG. 11. The on-screen options of screen 216 may be used to adjust settings for circuitry 314 (FIG. 7) to allow fast blocks to receive higher overdrive voltages Vcchg2 and to allow slow blocks to receive lower overdrive voltages Vcchg1. The arrangement of FIG. 11 is merely illustrative. Any suitable arrangement may be used to obtain settings information from the logic designer (e.g., using tools 64 of FIG. 3). Moreover, default settings can be used in place of user-adjustable settings if desired.

In the illustrative arrangement of FIG. 11, option 218 may be used to choose whether or not to allow the CAD tools 62 to automatically attempt to use mixed overdrive voltages. If option 218 is selected (by clicking on the associated box), the tools 62 will evaluate circuit implementations that involve various different memory element power supply settings and will identify a circuit implementation that satisfies the logic designer's timing constraints and other design constraints by selectively placing certain critical circuit blocks in fast mode while placing noncritical circuit blocks in slow mode to reduce gate oxide stress.

If option 220 is selected, CAD tools 62 will limit the recommended memory element power supply settings based on manual user input. Option 222 may be selected if the user desires to make manual resource assignments using table 224. The first column of table 224 contains resource identifiers. The second column of table 224 contains the desired adjustable memory element power supply settings to be used for the resources. In the example of FIG. 11, the logic designer has manually specified that the memory elements 20 associated with circuit block 123 should be powered using the "fast mode" memory element setting (e.g., Vcchg is equal to Vccgh2 and ground is equal to Vss for the memory elements and the gates of associated pass transistors in circuit block 123), whereas circuit block 456 should be powered using the "slow mode" memory element setting (e.g., Vcchg is Vccgh1 and ground is Vss for the memory elements and the gates of associated pass transistors in circuit block 456). Logic design system 56 may follow all user commands or may modify user input to ensure that no design violations arise. For example, logic design system 56 may modify user-specified fast/slot allocations to ensure that a default or user-specified level of reliability (from gate oxide thickness considerations) is attained.

Figure 12:
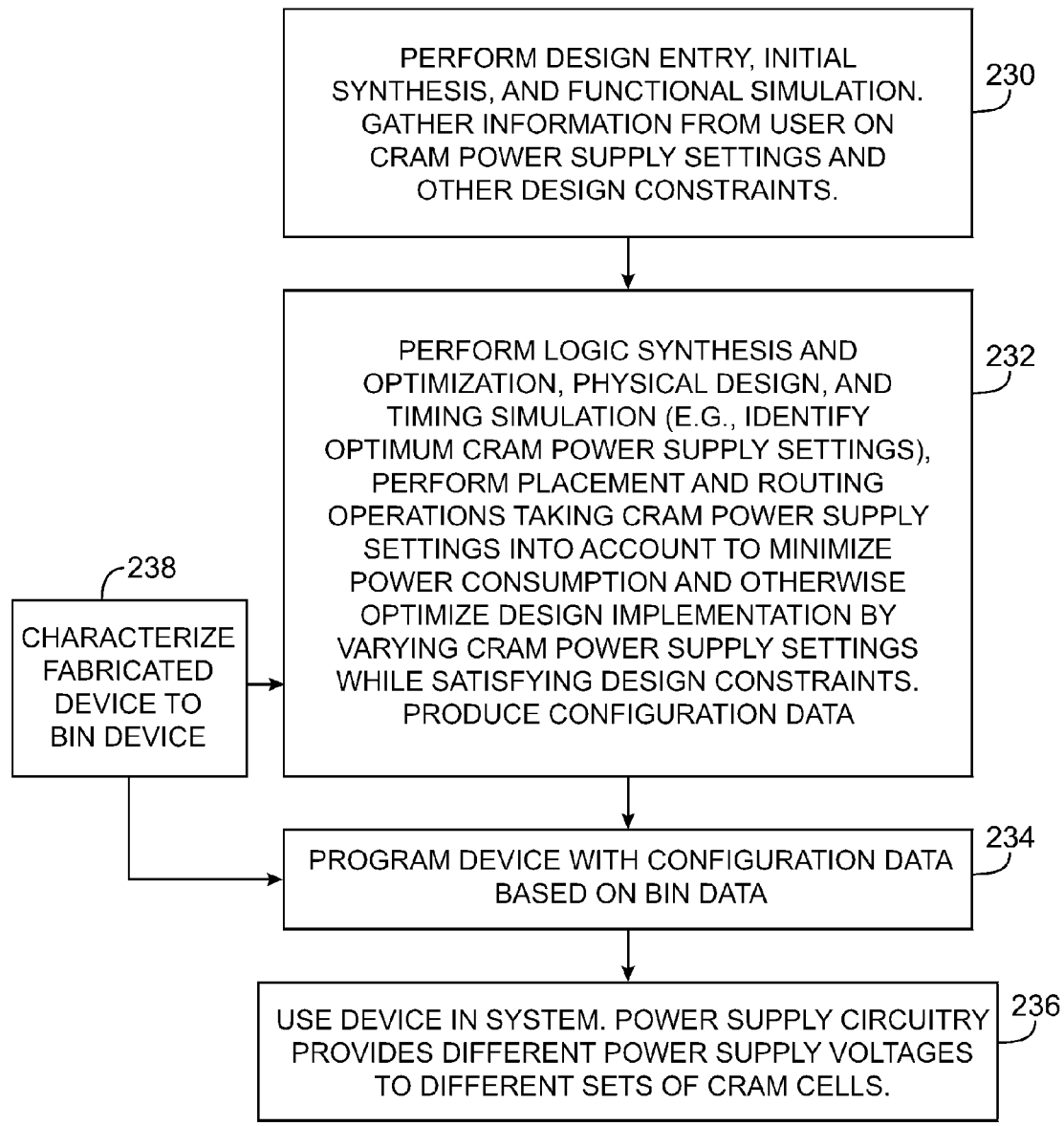
FIG. 12 is a flow chart of illustrative steps involved in using a logic design system to satisfy circuit performance criteria while optimizing reliability by minimizing overdrive voltages for noncritical in accordance with an embodiment of the present invention.

Illustrative steps involved in using logic design system 56 to implement a custom logic design in an integrated circuit by selecting memory element settings that selectively configure various circuit blocks with different overdrive voltages Vcchg are shown in FIG. 12.

At step 230, tools such as design and constraint entry tools 64 use input screens to obtain the desired custom logic design from the logic designer. The design includes design constraints such as timing constraints, signal strength constraints, logic function constraints, etc. A settings screen such as screen 216 of FIG. 11 and/or other suitable user input arrangements are used to gather user settings related to identifying one or more appropriate memory element power supply levels. If desired, some or all settings may be provided as defaults.

During step 230, the user can specify constraints such as delay or speed limits, desired memory element power supply voltages, current drive limits, noise level limits, core voltage settings, I/O voltage settings, etc. For example, a user may specify a requirement or preference that a particular circuit path operate at a particular minimum speed or maximum delay. If desired, settings such as these may be provided as defaults (e.g., when a user does not specify any such constraints).

At step 232, logic synthesis and optimization, physical design, and timing simulation operations may be performed using tools 72, 74, 76, and 78 of FIG. 3. During these operations, logic design system 56 may process the design constraints and memory element power supply level settings obtained at step 230 to produce a design implementation for integrated circuit 10. In particular, based on the user-supplied settings gathered using screen 216 of FIG. 11, system 56 may identify memory element power supply voltages (Vcchg values) to be used in powering memory elements 20 for various circuit blocks on integrated circuit 10 when circuit 10 is used in a system of the type described in connection with FIG. 2. Logic design system 56 may allocate resources and perform placement operations that ensure that the implementation of the desired custom logic circuit satisfies design constraints. Some regions of the circuitry on device 10 may be placed in a slow operating mode, some may be placed in a fast operating mode, etc.

During step 232, design system 56 may produce corresponding configuration data for programming integrated circuit 10. Device resources are allocated so that components that are most able to handle slow circuit region performance degradations associated with lowered memory element power supply voltages are powered using the lowered memory element power supply settings. Components that require higher levels of performance are powered using higher memory element power supply settings. This allows design system 56 to minimize gate oxide stress by using Vcchg1 wherever possible while using Vcchg2 in locations where necessary to ensure that design constraints (e.g., critical path timing constraints) are not violated.

Integrated circuit 10 may be programmed with the configuration data produced during step 232 at step 234. Some of the configuration data produces control signals that control transistors in the adjustable memory element power supplies on the device. Other configuration data bits are loaded into the CRAM cells that are powered by the adjustable CRAM power supplies and which produce output signals to control associated pass transistors.

If desired, integrated circuits may be characterized as part of a manufacturing process (step 238). For example, measurements such as gate oxide thickness measurements and electrical measurements may be used in characterizing each integrated circuit die that is fabricated. When a given integrated circuit is determined to have a relatively thick gate oxide, that integrated circuit may be allocated to a "thick" bin. When a given integrated circuit is determined to have a relatively thin gate oxide, that integrated circuit may be allocated to a "thin" bin. There may be any suitable number of different bins (e.g., two, three, four, five, more than five, etc.). The bin information that is gathered in this way may be used by system 56 to predict the maximum desirable Vcchg values that may be used on that circuit. Thick bin devices may be able to withstand larger Vcchg values than thin bin devices, so adjustable power supply circuit 300 may be used to increase the values of Vcchg1 and/or Vcchg2 on thick bin devices relative to thin bin devices. As shown in FIG. 12, the bin information may be used in generating bin-appropriate configuration data (step 232) and/or may be used in loading bin-appropriate configuration data into integrated circuit 10 (step 234) to ensure that each integrated circuit has Vcchg1 and Vcchg2 values that are adjusted appropriately.

At step 236, the device that has been programmed may be use in a system of the type described in connection with FIG. 2.

The foregoing is merely illustrative of the principles of this invention and various modifications can be made by those skilled in the art without departing from the scope and spirit of the invention.

What is claimed is:

1. A method for overdriving transistors in circuit blocks on an integrated circuit, comprising:
    powering a first set of memory elements with a ground voltage and a first power supply voltage;
    powering a second set of memory elements with the ground voltage and a second power supply voltage that is greater than the first power supply voltage;
    overdriving transistors in a first set of circuit blocks by supplying static output control signals at the first power supply voltage from the first set of memory elements to the transistors in the first set of circuit blocks; and
    overdriving transistors in a second set of circuit blocks by supplying static output control signals at the second power supply voltage from the second set of memory elements to the transistors in the second set of circuit blocks.

2. The method defined in claim 1 wherein powering the first set of memory elements comprises routing the first power supply voltage to the first set of memory elements using a plurality of programmable multiplexers, each programmable multiplexer having a first input operable to receive the first power supply voltage, a second input operable to receive the second power supply voltage, and an output to which the first power supply voltage is routed from the first input.

3. The method defined in claim 1 wherein powering the first set of memory elements comprises routing the first power supply voltage to the first set of memory elements using a plurality of first programmable multiplexers, each of the plurality of first programmable multiplexers having a first input operable to receive the first power supply voltage, a second input operable to receive the second power supply voltage, and an output to which the first power supply voltage is routed from the first input, and wherein powering the second set of memory elements comprises routing the second power supply voltage to the second set of memory elements using a plurality of second programmable multiplexers, each of the plurality of second programmable multiplexers having a first input operable to receive the first power supply voltage, a second input operable to receive the second power supply voltage, and an output to which the second power supply voltage is routed from the second input.

4. The method defined in claim 1, wherein the integrated circuit comprises logic circuits that are powered at a power supply voltage that is less than the first power supply voltage and that is also less than the second power supply voltage.

5. The method defined in claim 1, wherein the integrated circuit comprises a programmable logic device integrated circuit, wherein the first and second sets of memory elements are loaded with configuration data, and wherein the transistors comprise n-channel metal-oxide-semiconductor transistors.

6. The method defined in claim 1, wherein the integrated circuit comprises a programmable logic device integrated circuit, wherein the first and second sets of memory elements are loaded with configuration data, wherein overdriving the transistors in the first set of circuit blocks comprises supplying the static output control signals at the first power supply voltage to gates of n-channel metal-oxide-semiconductor transistors in the first set of circuit blocks, and wherein overdriving the transistors in the second set of circuit blocks comprises supplying the static output control signals at the second power supply voltage to gates of n-channel metal-oxide-semiconductor transistors in the second set of circuit blocks.

7. The method defined in claim 1 wherein the first power supply voltage is adjustable and wherein powering the first set of memory elements comprises providing control signals from programmable memory elements on the integrated circuit to adjust first power supply voltage.

8. The method defined in claim 1 wherein the first power supply voltage is adjustable, wherein powering the first set of memory elements comprises providing first control signals from first programmable memory elements on the integrated circuit to a first adjustable voltage regulator to adjust the first power supply voltage, wherein the second power supply voltage is adjustable, and wherein powering the second set of memory elements comprises providing second control signals from second programmable memory elements on the integrated circuit to a second adjustable voltage regulator to adjust the second power supply voltage.

9. The method defined in claim 1 wherein the first power supply voltage is adjustable, wherein powering the first set of memory elements comprises providing first control signals from first programmable memory elements on the integrated circuit to a first adjustable charge pump to adjust the first power supply voltage, wherein the second power supply voltage is adjustable, and wherein powering the second set of memory elements comprises providing second control signals from second programmable memory elements on the integrated circuit to a second adjustable charge pump to adjust the second power supply voltage.

10. The method defined in claim 2, wherein the first power supply voltage is adjustable and wherein powering the first set of memory elements comprises providing control signals from programmable memory elements on the integrated circuit to adjust the first power supply voltage.

11. The integrated circuit defined in claim 3, wherein the first power supply voltage is adjustable, wherein powering the first set of memory elements comprises providing first control signals from first programmable memory elements on the integrated circuit to a first adjustable voltage regulator to adjust the first power supply voltage, wherein the second power supply voltage is adjustable, and wherein powering the second set of memory elements comprises providing second control signals from second programmable memory elements to a second adjustable voltage regulator to adjust the second power supply voltage.

12. An integrated circuit comprising:
    a plurality of transistors with transistor gates;
    memory elements operable to provide static output control signals to the transistor gates; and
    adjustable circuitry operable to be loaded with configuration data to selectively power the memory elements, wherein a first subset of the transistor gates is operable to receive static output control signals at an overdrive voltage, and wherein a second subset of the transistor gates is operable to receive static output signals at a reduced voltage lower than the overdrive voltage.

13. The integrated circuit defined in claim 12, further comprising:
   a first multiplexer operable to receive the overdrive voltage and the reduced voltage from the adjustable circuitry, wherein the first multiplexer is further operable to output the overdrive voltage to the memory elements associated with the first subset of the transistor gates; and
   a second multiplexer operable to receive the overdrive voltage and the reduced voltage from the adjustable circuitry, wherein the second multiplexer is further operable to output the reduced voltage to the memory elements associated with the second subset of the transistor gates.

14. The integrated circuit defined in claim 12, wherein the adjustable circuitry comprises voltage regulator circuitry operable to receive control signals from associated programmable memory elements, wherein the adjustable circuitry is further operable to generate the overdrive voltage and the reduced voltage in response to the control signals.

15. The integrated circuit defined in claim 12 wherein the adjustable circuitry comprises:
   a first adjustable voltage regulator operable to supply the overdrive voltage that is adjustable by control signals provided from first programmable memory elements; and
   a second adjustable voltage regulator operable to supply the reduced voltage that is adjustable by control signals provided from second programmable memory elements.

16. The integrated circuit defined in claim 15, wherein the adjustable circuitry further comprises a charge pump operable to receive signals from external pins and wherein the charge pump is further operable to generate a corresponding output for application as an input to the first and second adjustable voltage regulators.

17. An integrated circuit, comprising:
   a first set of transistors;
   a second set of transistors;
   a first set of memory elements powered by a first power supply voltage; and
   a second set of memory elements powered by a second power supply voltage that is greater than the first power supply voltage, wherein the first set of memory elements is operable to supply static output control signals to the first set of transistors at the first power supply voltage to overdrive the first set of transistors and wherein the second set of memory elements is operable to supply static output control signals to the second set of transistors at the second power supply voltage to overdrive the second set of transistors.

18. The integrated circuit defined in claim 17, further comprising:
   a plurality of first programmable multiplexers operable to receive the first and second power supply voltages and wherein the plurality of first programmable multiplexers is further operable to output the first power supply voltage; and
   a plurality of second programmable multiplexers operable to receive the first and second power supply voltages and wherein the plurality of second programmable multiplexers is further operable to output the second power supply voltage.

19. The integrated circuit defined in claim 17, wherein the first power supply voltage is adjustable, wherein powering the first set of memory elements comprises providing first control signals from first programmable memory elements on the integrated circuit to a first adjustable voltage regulator to adjust the first power supply voltage, wherein the second power supply voltage is adjustable, and wherein powering the second set of memory elements comprises providing second control signals from second programmable memory elements to a second adjustable voltage regulator to adjust the second power supply voltage.

20. The integrated circuit defined in claim 17, wherein the integrated circuit comprises logic circuits operable to be powered at a power supply voltage less than the first power supply voltage and also less than the second power supply voltage.

* * * * *